United States Patent [19]
Weisbuch et al.

[11] Patent Number: 5,187,715
[45] Date of Patent: Feb. 16, 1993

[54] QUANTUM WELL OPTICAL DEVICE

[75] Inventors: Claude Weisbuch, Paris; Philippe Bois, Cesson; Borge Vinter, Paris, all of France

[73] Assignee: Thomson-CSF, Puteaux, France

[21] Appl. No.: 620,041

[22] Filed: Nov. 30, 1990

[30] Foreign Application Priority Data

Dec. 5, 1989 [FR] France ............................ 89 16035

[51] Int. Cl.$^5$ .............................................. H01S 3/19
[52] U.S. Cl. ........................................ 372/46; 372/45
[58] Field of Search ................. 372/44, 45, 46, 50, 372/43; 357/16, 17

[56] References Cited

U.S. PATENT DOCUMENTS 4,849,986  7/1989  Boesner et al. ...................... 372/50

FOREIGN PATENT DOCUMENTS 0306400  3/1989  European Pat. Off. .

OTHER PUBLICATIONS

Masahiro Asada et al., "Gain and the Threshold of Three-Dimensional Quantum-Box Lasers", IEEE Journal of Quantum Electronics, vol. No. 9, Sep. 1986, pp. 1915-1921.

Optical Engineering, vol. 26, No. 5, May 1987, pp. 368-372, D. A. B. Miller, "Quantum Wells for Optical Information Processing".

Electronics Letters, vol. 25, No. 16, Aug. 3, 1989, pp. 1063-1065, E. Rosencher et al., "Second Harmonic Generation by Intersub-Band Transitions in Compositionally Asymmetrical MQWs".

*Primary Examiner*—James W. Davie
*Attorney, Agent, or Firm*—Oblon, Spivak, McClelland, Maier & Neustadt

[57] ABSTRACT

A quantum well optical device including a layer of semiconducting material of large forbidden band width and, situated in this layer, at least one quantum well, such as a quantum line or quantum hole, of a material having a narrower forbidden band than that of the layer. This quantum well has two permitted electron levels. Means exist of assuring the electron population of the first permitted energy level.

24 Claims, 10 Drawing Sheets

Quantum state
1  1  1
($n_x = 1$, $n_y = 1$, $n_z = 1$)

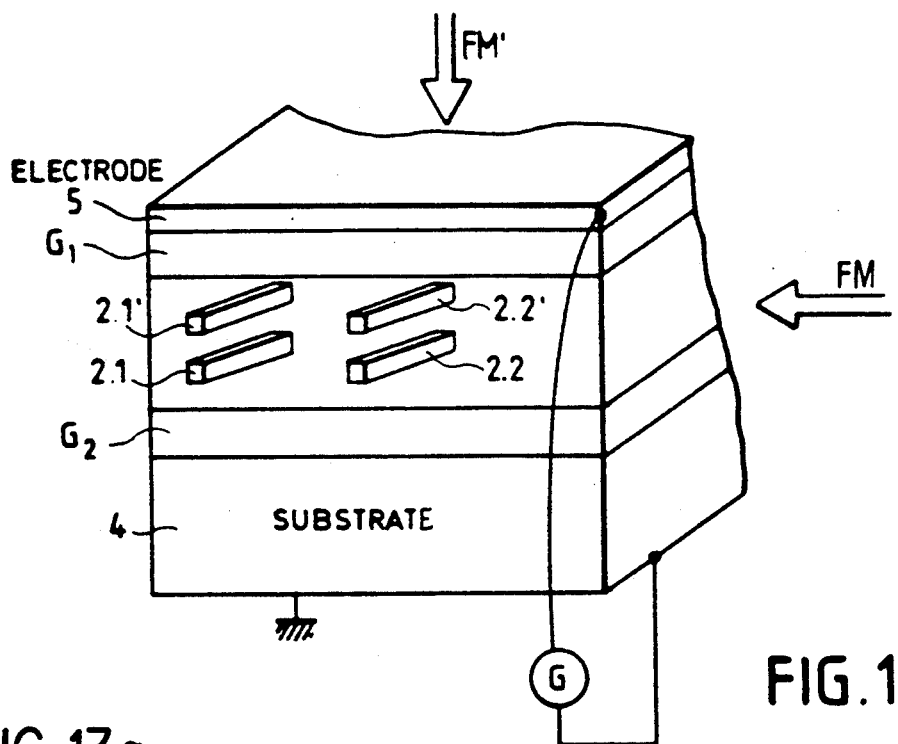
FIG. 12
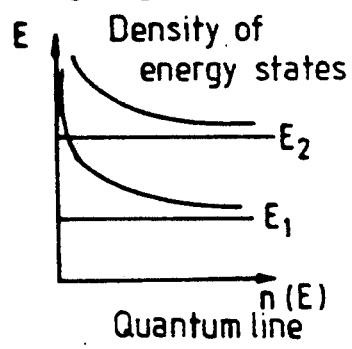
FIG. 13a
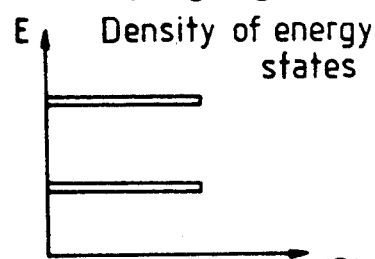
FIG. 13b
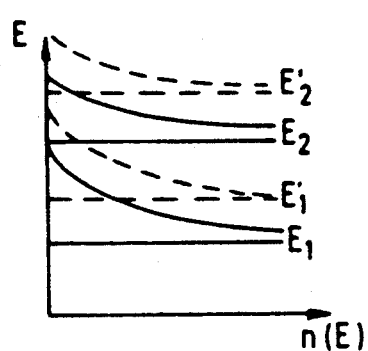
FIG. 13c
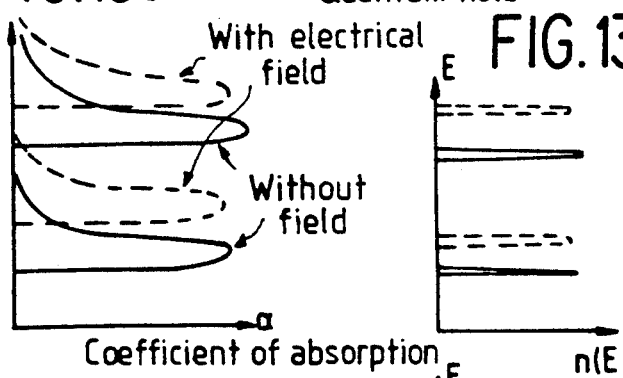
FIG. 13d
FIG. 13e
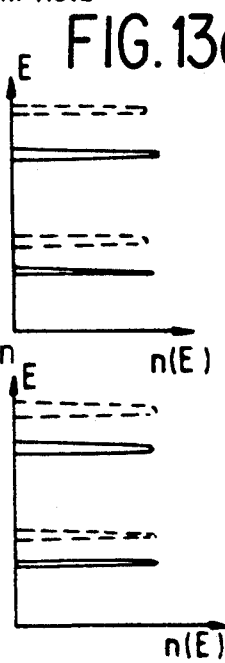
FIG. 13f

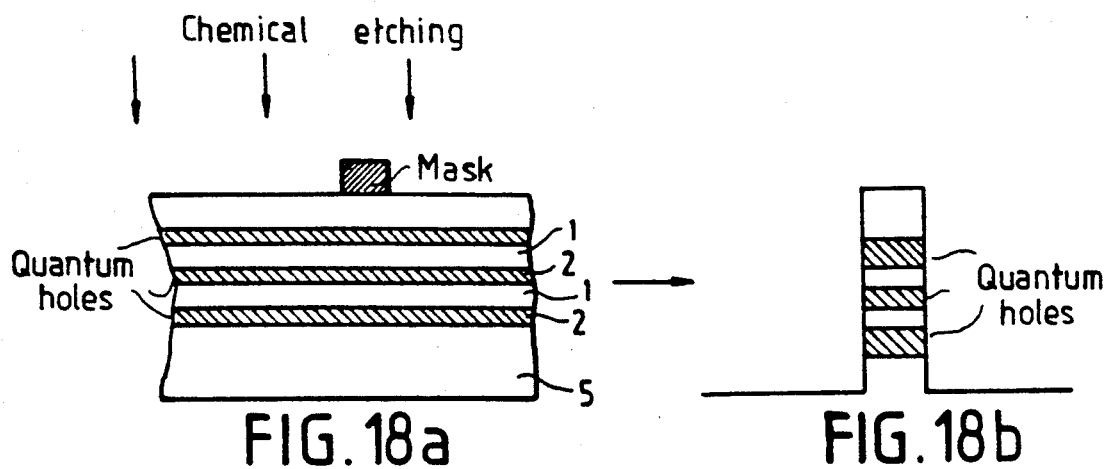
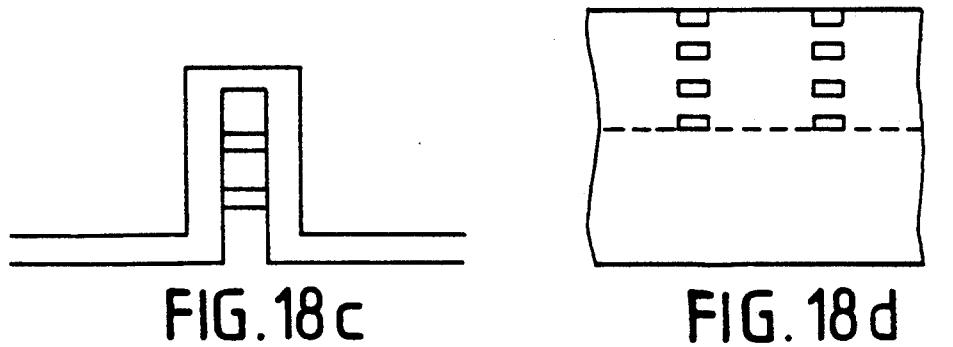
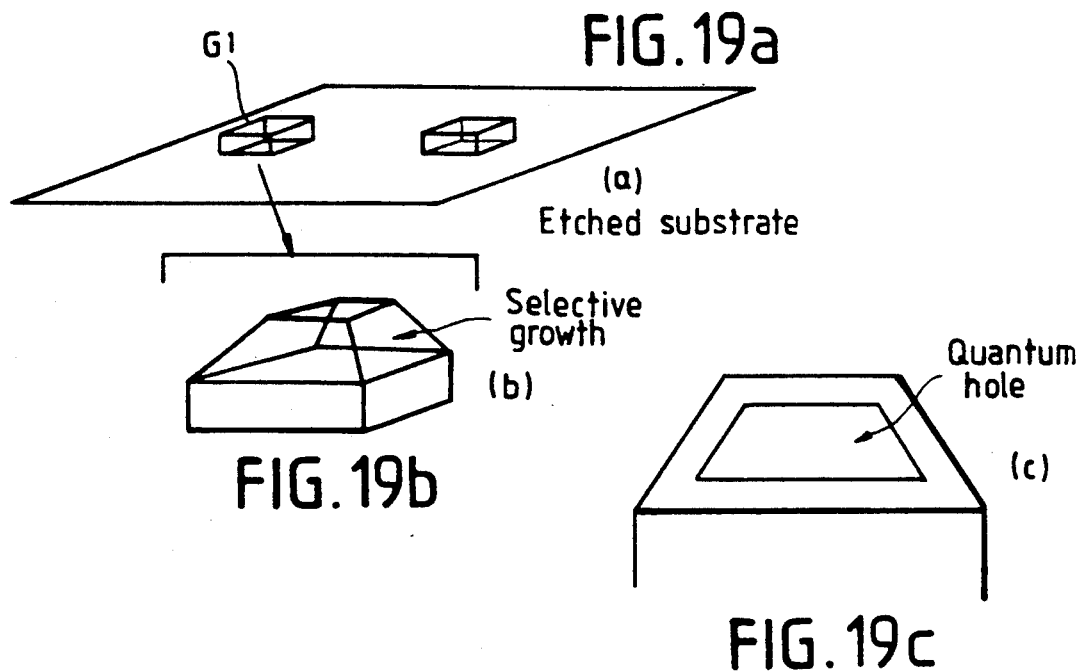

QUANTUM WELL OPTICAL DEVICE

BACKGROUND OF THE INVENTION

The invention concerns a quantum well optical device, in particular a device including quantum boxes or quantum wires applicable to optical and opto-electronic techniques, and methods of constructing this device.

In the field of long wavelength electromagnetic waves, and in particular wavelengths exceeding 2 μm, few optical and opto-electronic devices have been made from semiconductors. The reason is that there are few energy levels which are not strongly coupled to excitations of the structure. The only exceptions are semiconductors having a narrow forbidden band.

We propose here a new family of optical and opto-electronic devices in which energy levels are determined freely by the dimension of quantum holes and lines constituted of semiconducting materials inserted in matrices of other semiconductors.

The quantification of the energy levels of electrons and holes in ultra-thin semiconductor films ($\geq 20$ nm) is now well known (see the article "Fundamental Properties of III-V Semiconductor Two-Dimensional Quantized Structures: The Basis for Optical and Electronic Device Applications" by C. Weisbach in Semiconductors and Semimetals, Vol 24, R. Dingle Ed., Academic, New York 1987). This is shown in FIG. 1a in which an ultra-thin layer of semiconductor SC2 is placed between two semiconductors SC1 and SC3. The structure of the energy levels for the specially chosen semiconductors is shown in FIG. 1b; the quantified energy levels for the electrons ($E_1$, $E_2$) and the holes ($E'_1$, $E'_2$) in layer SC2 are also shown.

If we take the approximation of an infinitely deep potential well, the successive quantified energy levels are situated at a so-called confinement energy lying above the bottom of the conduction band and given by the formula:

$$E_n = n^2 \pi 2h^2/2m^*L^2$$

where n is the order of the level, h is the Planck constant, m* is the effective mass of the particle (electron or hole), L is the thickness of the film SC2.

We see that we can control freely the difference between the energy levels by the thickness of the film. This possibility is used in detectors where the range of sensitivity in wavelength is adjusted at the transistion E1-E2 by the film thickness.

If the thickness is sufficiently small there is only a single energy level within the well, the level E2 being situated above ΔEc in the continuum of the states of materials SC1 and SC3.

The extension to three dimensions of the concept of quantification of the energy levels is immediate. It is sufficient to consider a semiconductor box inserted in another semiconductor: the wave function of the electrons and holes will be quantified in the box if, as we explained in connection with FIG. 1b, the electron and hole energy levels are lower in the material constituting the box compared with the surrounding material (see FIG. 2).

What is unique about this system is that, in the infinite well approximation, the successive energy levels are given by the formula:

$$E_{nx,ny,nz} = \pi^2 h^{-2}/2m^* (nx^2/Lx^2 + ny^2/Ly^2 + nz^2/Lz^2)$$

where positive integers nx, ny and nz are the orders of the levels along the x, y and z axes, Lx, Ly and Lz are the dimensions of the box along the x, y and z axes The energy levels $E_{nx,ny,nz}$ can be separated by an energy which is either incommensurable with any phonon of the crystal, or greater than that of any phonon of the crystal. In this case, energy relaxation by transitions producing a single phonon in the crystal can not occur and the lifetime of the excited states becomes extremely long, of the order of the radiative lifetime. This situation is different from that in quantum films where the kinetic energy of the electrons along the film gives continuous energy levels of the type:

$$E_{nzk} = nz^2 \pi^2 h^2/2m^* Lz^2 + h^2 k^2/2m^*$$

where k is the wave vector of the electrons describing their free transmission in the plane.

Owing to the continuous energy levels, there are always energy levels between which transitions can be induced by phonons of the structure, as shown in FIG. 3.

The invention makes use of this situation to allow the construction of optical devices including quantum wells of limited dimensions.

SUMMARY OF THE INVENTION

The invention concerns a quantum well optical device characterized by the fact that it includes:

A layer of semiconductor material transparent to light waves having a given potential energy corresponding to the bottom of the conduction band for the electrons;

At least one quantum box limited in two dimensions (quantum line) or in three dimensions (quantum hole or quantum point), the material constituting this quantum well having a potential energy value at the bottom of the conduction band which is less than that of the layer of transparent semiconductor material, and possessing at least a first atomic energy level (ground state) and a second allowed level (excited level) whose corresponding energies lie between the potential energies of the bottoms of the preceding conduction bands;

Means of assuring the electron population of the first allowed energy level.

According to the invention, a number of wells of limited dimensions (quantum boxes or wires) may be involved.

The invention can be applied in the construction of a laser. The quantum well optical device is therefore characterized by the fact that:

The layer is oriented with its principal faces parallel to the xy plane of an xyz trihedron; the quantum holes are oriented in the x direction;

The faces of the layer perpendicular to the x axis are cleaved or treated optically to form an optical cavity;

An auxiliary source supplies a pump wave approximately perpendicular to the principal faces.

We also have an optical device characterized by the fact that the layer of transparent semiconductor material has two principal faces parallel to an xy plane of an xyz trihedron, each equipped with an electrode of the same conductivity type, a voltage generator being connected to these electrodes to apply a potential difference across the two faces of the structure. The faces of the layer perpendicular to the x axis are cleaved or treated optically to form an optical cavity.

The invention also concerns a detector, such as an optical device characterized by the fact that it includes electrodes of the same conductivity type on the two sides of the layer of transparent semiconductor material and a detector of potential difference connected to these electrodes.

The invention also concerns a light modulator, such as an optical device characterized by the fact that it includes electrodes of the same conductivity type on the two sides of the layer of transparent semiconductor material and a source applying a potential difference to the electrodes, a light beam being transmitted in the layer and being modulated by the device.

Finally, the invention concerns a method of construction of an optical device characterized by the fact that it includes:

A first stage of construction involving the deposit on a substrate of alternated layers of two materials having forbidden bands of different width;

A second step involving etching of individual parts in these layers.

BRIEF DESCRIPTION OF THE DRAWINGS

The various uses and characteristics of the invention will become clearer in the description given below, given as an example, and in the diagrams:

FIG. 12: an example of a quantum line modulator;

FIGS. 13a and 13b: density of states in quantum lines and holes;

FIGS. 13c to 13f: curves showing the effect of an electric field on the index and coefficient of absorption in quantum lines and holes;

FIGS. 18a to 18d: an example of a method of construction of the device according to the invention;

FIGS. 19a to 19c: another method of construction of the device according to the invention;

DETAILED DESCRIPTION OF THE INVENTION

FIGS. 1a, 1b, 2 and 3 show structural and electronic properties of quantum layers in quantum boxes, as discussed in the background section of the application.

A first embodiment of the invention concerns a laser using transitions between two energy levels E111 and E112 (denoted E1 and E2 in the text below) of a quantum hole.

Figure 1A:
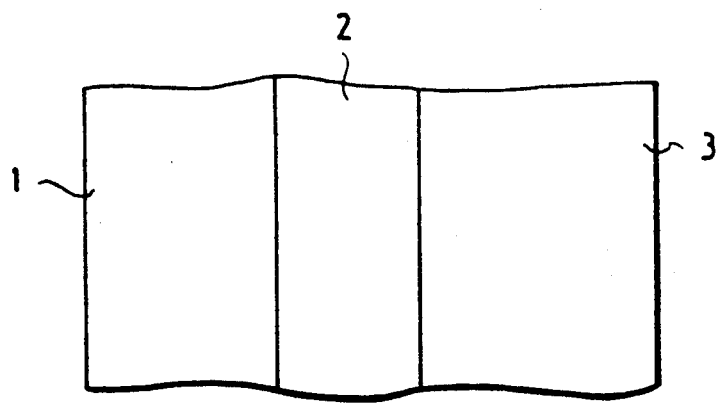
FIG. 1a shows an ultra-thin semiconductor layer between two other semiconductor layers.
Figure 1B:
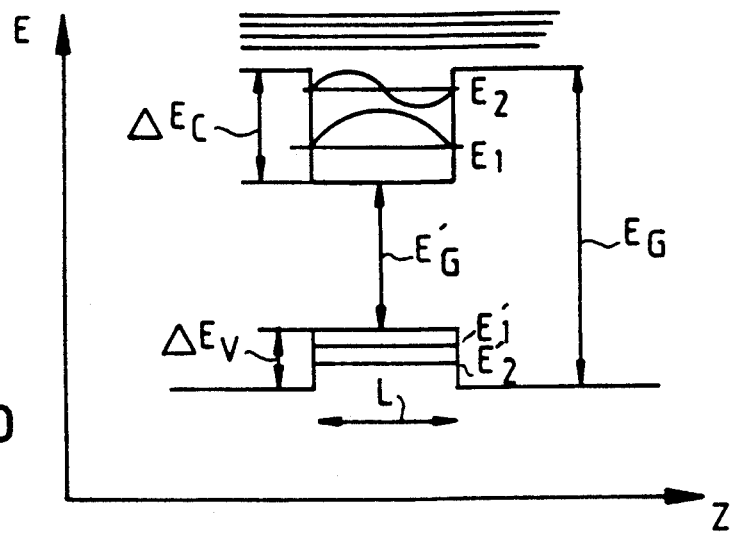
FIG. 1b shows the corresponding energy levels associated with the ultra-thin layer of FIG. 1.
Figure 2:
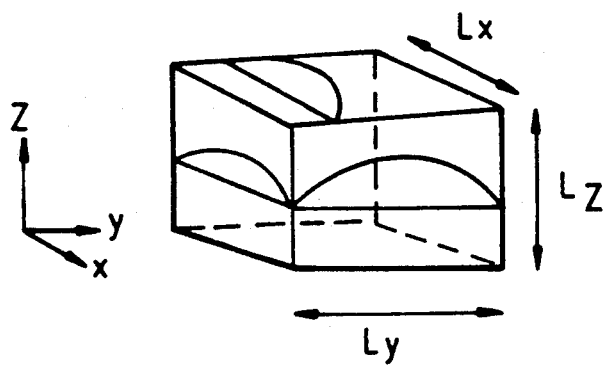
FIG. 2 shows a quantum box.
Figure 3:
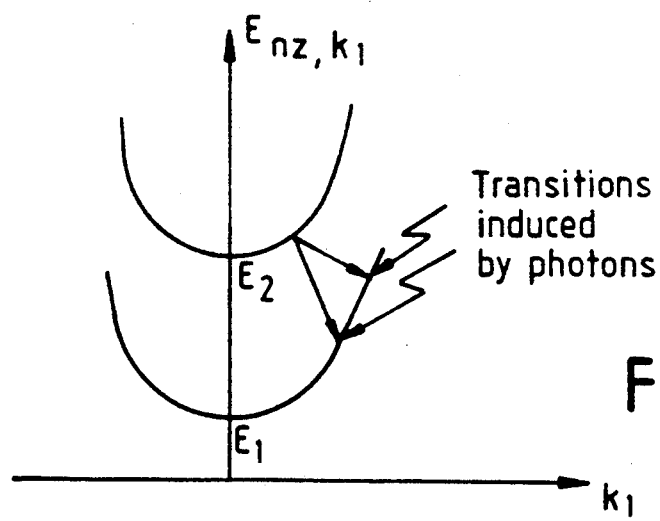
FIG. 3 shows energy band structure for electrons in a conduction band.
Figure 4A:
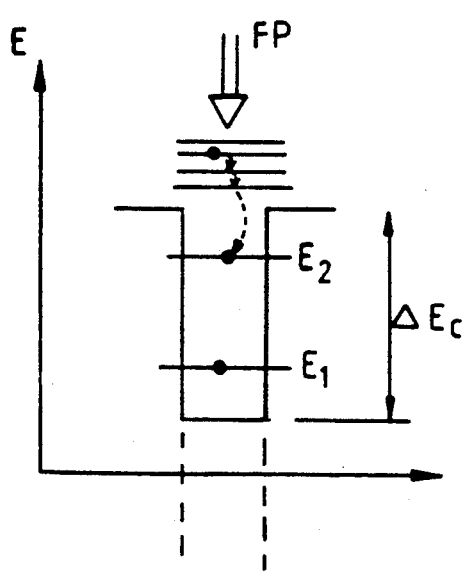
FIGS. 4a and 4b: diagrams of operation of quantum holes for optical pumping according to the invention.
Figure 4B:
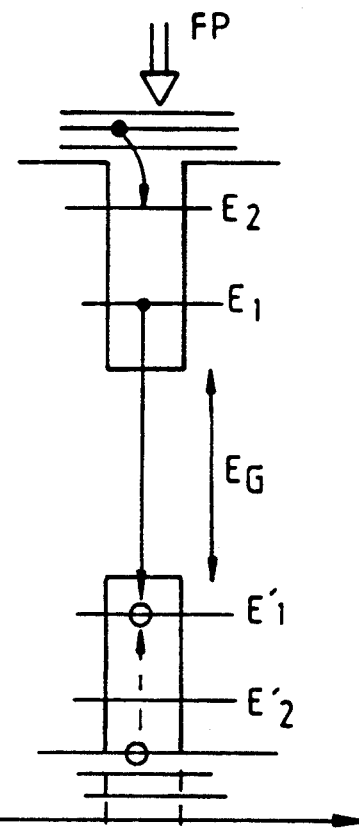
Figure 4C:
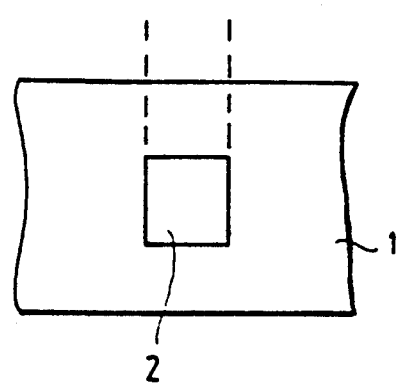
Figure 4D:
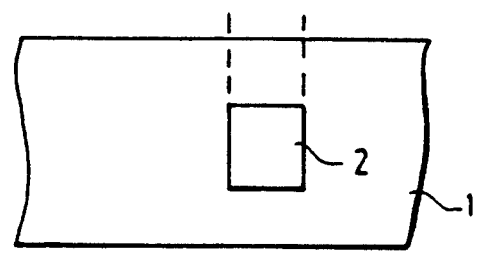

FIGS. 4a and 4b are energy diagrams of a quantum hole according to the invention.

FIG. 4a represents the conduction band of such a quantum hole and its intra-band operation.

At the bottom of FIG. 4a a quantum hole 2 is shown incorporated in a material 1.

As we can see in FIG. 4a, the energy corresponding to the bottom of the conduction band of the quantum hole 2 is lower than the bottom of the conduction band of material 1.

The dimensions of hole 2 are such that two allowed quantum energy levels are included in the quantum hole, i.e. between the energies of the bottom of the conduction bands of the quantum hole 2 and the material 1.

Inversion of the population can occur between levels $E_2$ and $E_1$ by the selective capture of electrons in the level $E_2$ from continuum states of the material forming the crystal matrix (material 2), and these electrons will slowly relax to level $E_1$.

The excitation to the continuum of the states of the matrix can be provoked in a different way depending on the implementation chosen.

Thus this excitation can occur with the aid of a wave of an optical pump FP whose energy $h\nu$ is greater than, or at least equal to, the difference $E_2-E_1$.

If the quantum hole 1 contains electrons by doping of one of the materials (1 or 2), these electrons can therefore be excited to the continuum states by optical pumping using any suitable light source. The electrons will relax rapidly to level 2 by emission of phonons (see FIG. 4a).

FIG. 4b represents the valence band (hole levels) and the conduction band (electron levels) of the device shown at the bottom of FIG. 4b.

One can also excite electrons from valence states by interband transition, creating holes in the quantum hole and/or in the material of the continuum. These holes will allow the recombination of electrons present in the ground state $E_1$ of the quantum holes, and therefore lead to a population inversion as soon as an electron is captured in the state $E_2$ of a quantum hole thus emptied (FIG. 4b). If there are no electrons initially in the quantum hole, inversion occurs following capture in the state $E_2$.

To achieve this, the structure is pumped using a wave FP of energy $h\nu$ equal to or greater than:

$$EG+E'+1\oplus EC$$

Figure 5:
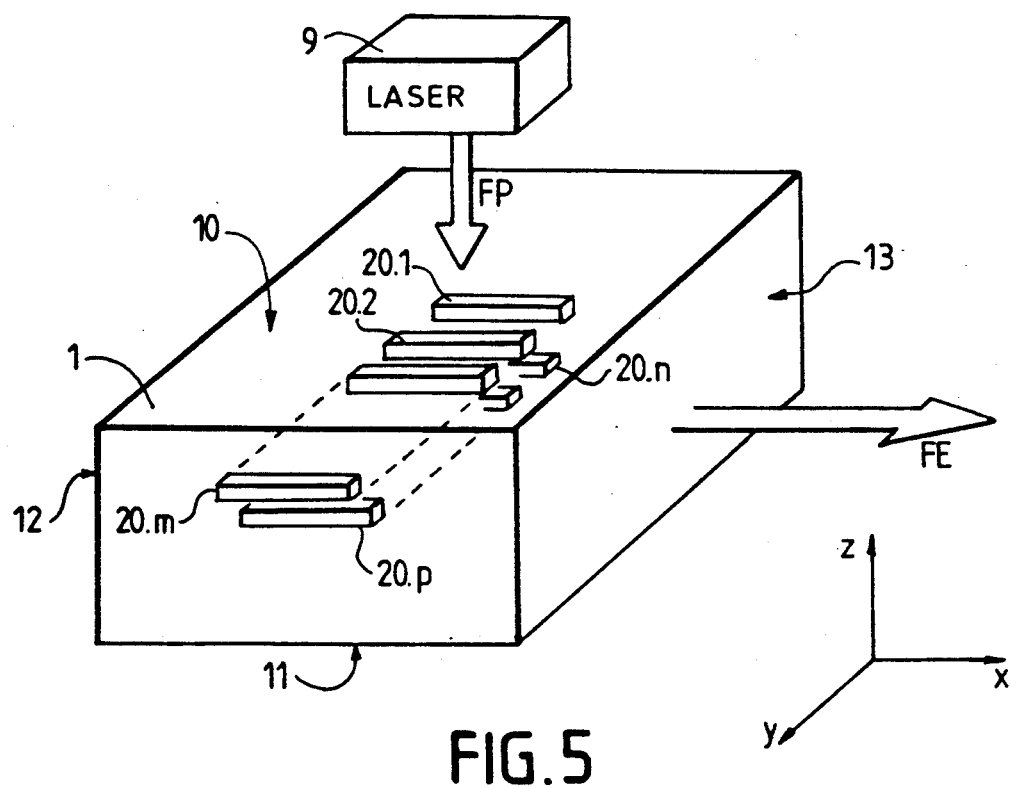
FIG. 5: an example of an embodiment of a quantum line laser optically pumped.

FIG. 5 shows an example of a laser pumped by a diode laser according to the invention.

This laser is made of semiconducting material transparent at the wavelength of a pump wave. It includes a layer 1 of semiconducting material in the form of a trihedron xyz with the principal faces lying in the xy plane. The layer 1 includes quantum lines 20.*l* to 20.*m* parallel to the x direction. These lines are spaced such that there is no electronic coupling between them.

The material of the quantum lines is chosen such that the energy of the bottom of the condition band is less than that of the material of layer 1.

The faces 12 and 13 are cleaved or treated to be reflecting at the emission frequency of the laser and constitute an optical cavity.

The orientation of the quantum lines relative to the faces 12 and 13 is such that they are perpendicular to the planes of faces 12 and 13.

The luminous emission FE therefore occurs in a direction perpendicular to faces 12 and 13.

According to a preferred embodiment of the invention, the quantum wires 20.1 to 20*m* lie parallel to faces 10 and 11. The beam of the pump FP emitted by a diode laser 9 is received perpendicularly to the plane of these quantum lines.

Several parallel planes of quantum wires can be used. In FIG. 5, two planes of wires 20.1 to 20.*m* and 20.*n* to 20.*p* are shown, but other planes could be included.

In addition, according to a preferred embodiment of the invention, the quantum wires 20.*n* to 20.*p* and 20.1 to 20.*m* are staggered relative to the direction of the pump wave FP, which allows excitation of a maximum number of the quantum wires.

Figure 6:
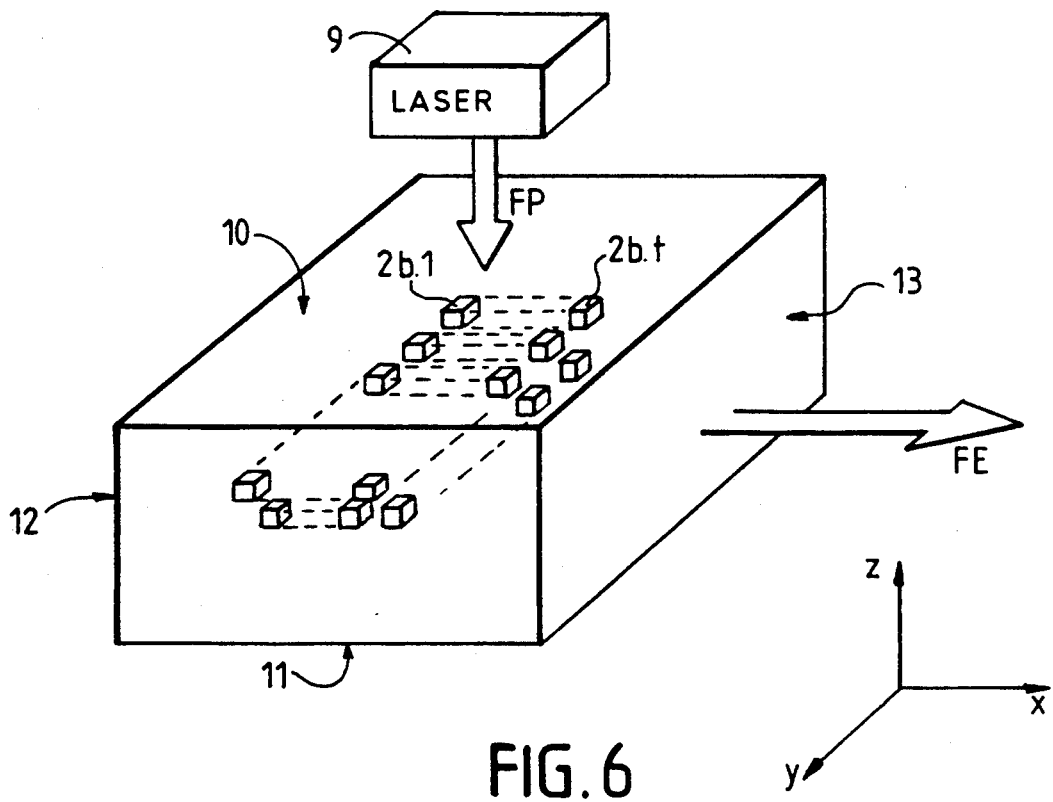
FIG. 6: an example of an embodiment of a quantum hole laser optically pumped.

FIG. 6 shows a laser, according to the invention, in which the layer of semiconducting material includes quantum boxes. The example shown in this figure is derived from that in FIG. 5 by replacing the quantum wires such as 20.1 by rows of quantum boxes such as 2*b*.1 to 2*b*.*t*.

Another version of the invention concerns an electrically excited laser.

Figure 7:
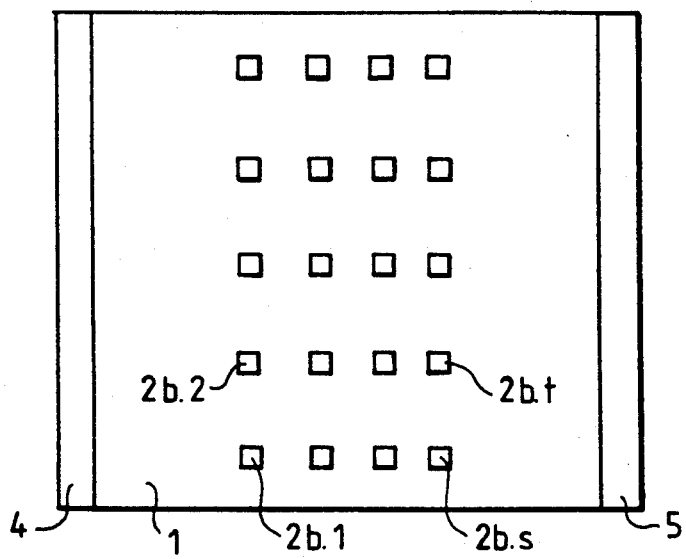
FIGS. 7 and 8: an example of an embodiment of a laser excited electrically.

For this, as shown in FIG. 7, a structure includes lines of quantum boxes, such as 2*b*.1 to 2*b*.*s* and 2*b*.2 to 2*b*.*t*, in a layer 1 of semiconducting material. These lines of boxes lie between the electrodes 4 and 5, and approximately perpendicular to them.

The electrodes 4 and 5 have the same type of conductivity.

Figure 8:
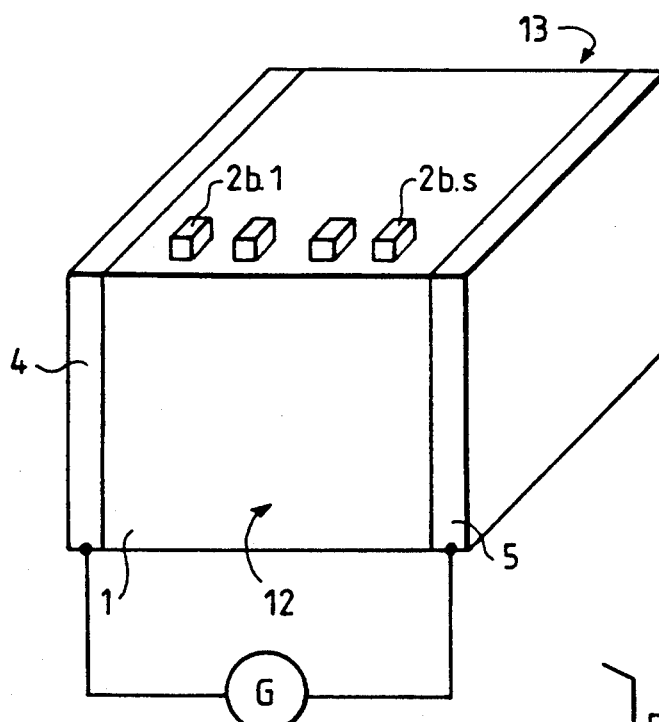

As shown in FIG. 8, the lateral faces 12 and 13 of the device are cleaved or treated to form mirrors and thus form an optical cavity.

Figure 9:
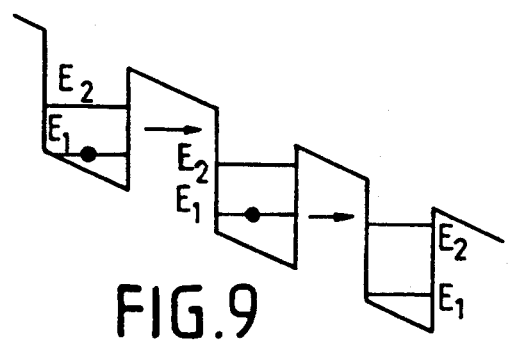
FIG. 9: an energy diagram of the laser shown in FIGS. 7 and 8.

FIG. 9 shows an energy diagram of this laser when a potential difference is applied by the generator across the electrodes 4 and 5.

The lines of quantum holes are sufficiently close to each other to communicate by the tunnel effect.

FIG. 9 shows a possibility of transfer where electrons communicate from hole to hole via the resonant tunnel effect of the ground state $E_1$ of one and the excited state $E_2$ of the other. Since the probability of excitation from $E_2$ to the continuum or another state $E_2$ is much greater than for excitations to the $E_1$ level, a population inversion is achieved.

Figure 10:
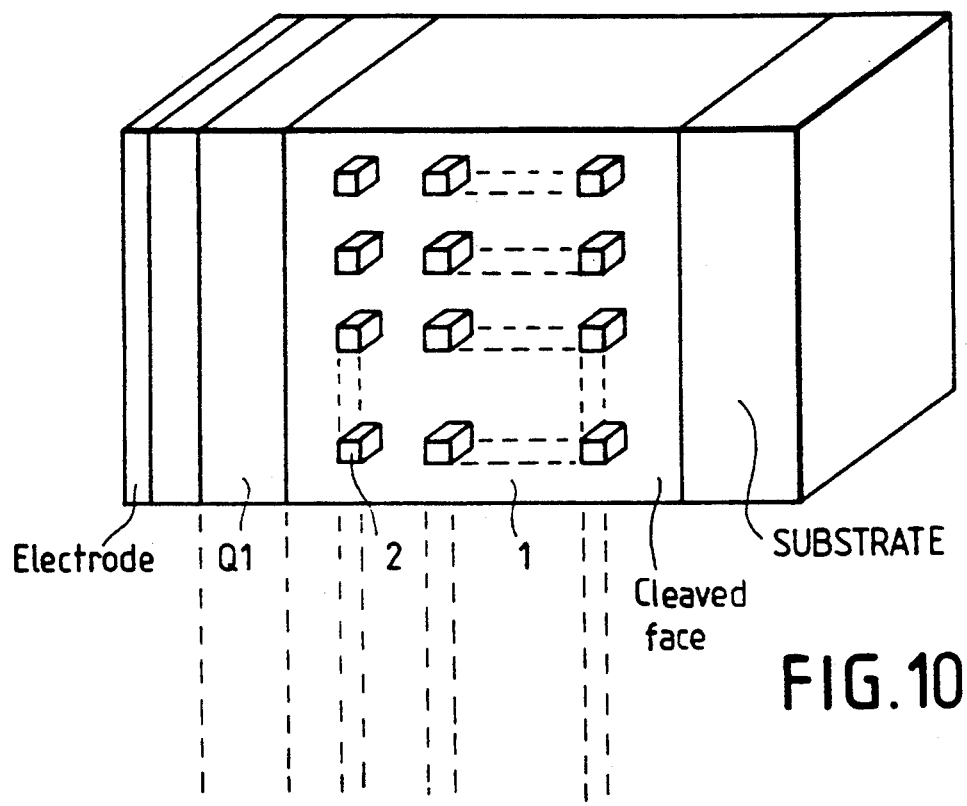
FIG. 10: a variant of the laser shown in FIGS. 7 and 8.
Figure 11:
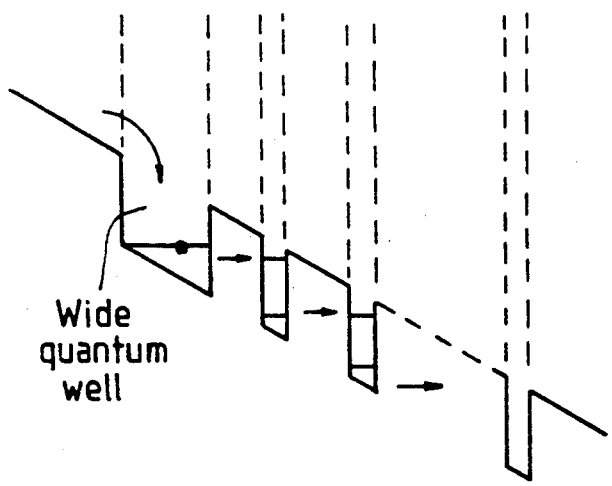
FIG. 11: an energy diagram of the laser shown in FIG. 10.

A variant of this device is indicated in FIG. 10 where electrons are injected by tunnel effect from a wide level, such as a wide quantum well Q1, which allows collection of a high electron density from the injecting electrode before their efficient tunnel transfer to the quantum holes, as shown in the energy diagram of FIG. 11. We can also note that if the thermionic emission of the electrons in the holes is more rapid than the relaxation from level 2 to level 1, the electronic transport arising from the thermionic emission also leads to population inversion.

The invention can also be applied to the construction of an optical modulator.

For this, using known techniques, materials having the highest possible electro-optic coefficient are used, which allows very small devices to be made and/or control by very small potential differences.

According to the invention, a modulator is made using quantum lines or quantum holes such as the modulator shown in FIG. 12. These lines or holes are made from semiconducting material such that two or three of their dimensions are of the order of the de Broglie wavelength of the electrons (about 20 nm).

The modulator shown in FIG. 12 includes a substrate S, either with n+ doping or semi-insulating, covered by a doped layer, a layer 1 of semiconducting material which is transparent at the wavelength to be modulated.

The layer 1 contains quantum wires 2.1 to 2.2' arranged parallel to the plane of layer 1 and orthogonal to the direction of the light beam to be modulated. The electrodes 4 and 5, which have the same type of conductivity, are situated on each side of the layer 1 and a source of electrical tension G is connected across them. The light flux to be modulated arrives parallel to the plane of the layer (beam FM), or perpendicular to it (beam FM') in which case the electrode 5 is transparent.

To improve the modulation, the layer 1 can be supplemented by optical guide layers G1 and G2.

Figure 21:
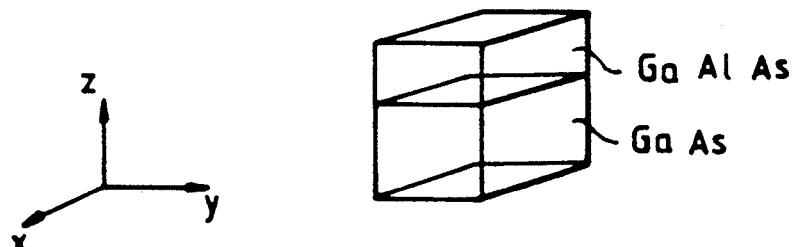
FIG. 21: an asymmetric quantum box.
Figure 22A:
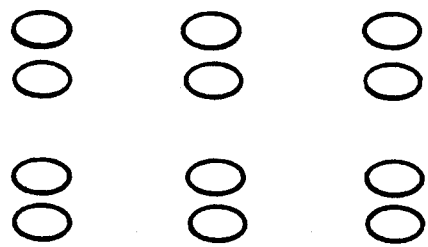
FIGS. 22a and 22b: coupled quantum holes and lines.
Figure 22B:
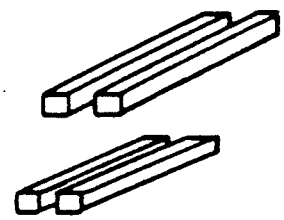

The expected gain of such structures is due to a number of properties:

The density of the quantum states characteristic of one- or zero-dimensional systems (FIGS. 13*a*, 13*b*). Consequently, any change of level induced by a field has a large effect on the absorption spectrum (FIGS. 13*c*, 13*d*);

The energy levels of the zero-dimensional system (quantum hole) are discrete, therefore the energy relaxation effects are very much slowed down, or even prevented for any phonon transition as soon as the distance between the quantum levels exceeds the optical phonon energy (36 meV for GaAs);

It can be advantageous to use systems which are asymmetric (FIG. 21) or allowing charge transfer such as coupled quantum lines or holes (FIGS. 22*a*, 22*b*) since the charge transfer occurs over a larger distance than in simple systems, which produces electrical dipoles—and therefore polarizations—which are larger when an electrical field is applied.

This effect can be used when the invention is used in a bistable optical or electro-optical device, analogous to the devices made from quantum films operating by interband transitions (see for example the document "Quantum wells for optical information processing", by D. A. B. Miller, Optical Engineering 26–368, 1987).

The modulator can be used to modulate amplitude (thanks to the absorption change produced by the electric field) or phase (thanks to the change of index associated with the absorption by the Kramers-Kronig relations).

Figure 14:
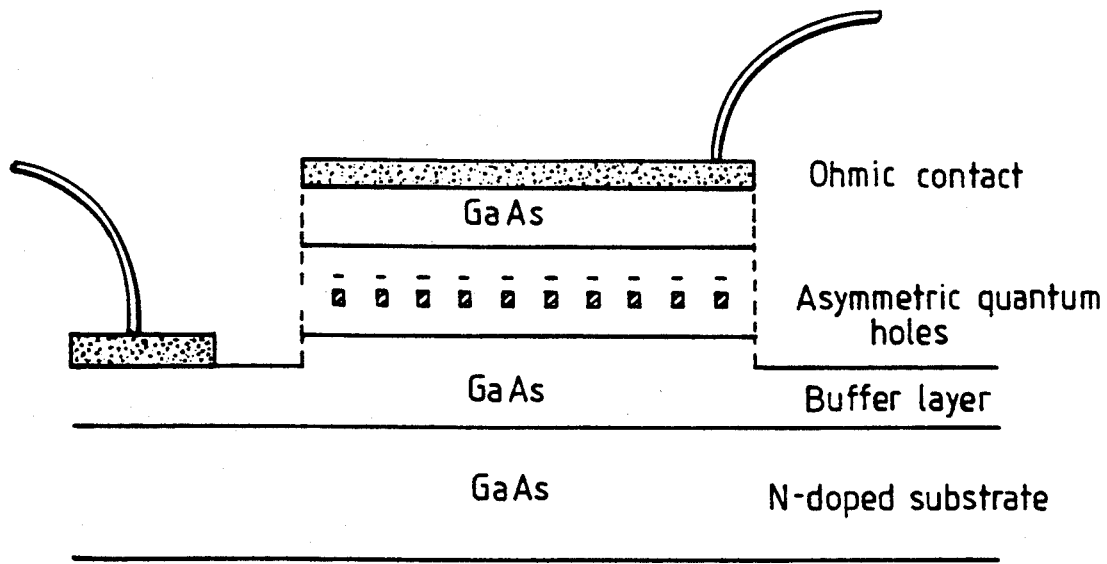
FIGS. 14 to 16: an asymmetric quantum hole device for photovoltic detection.
Figure 15:
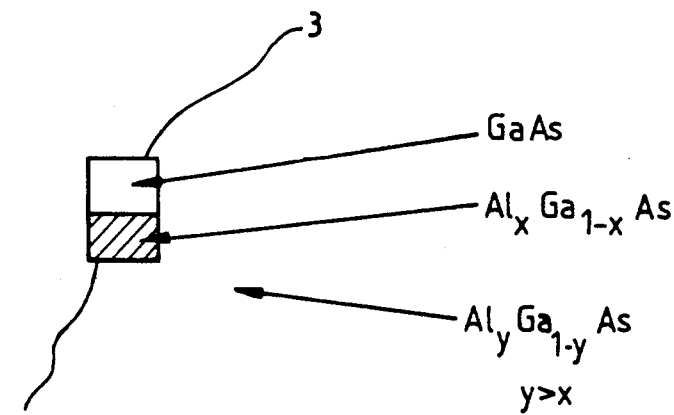

FIGS. 14 and 15 show a variant of the invention in which the quantum wells (lines or holes) (example given: quantum holes) are made in the form of structures of asymmetric quantum wells having enhanced non-linear optical properties. These properties have been described in the following documents:

E. Rosencher, P. Bois, J. Nagle, E. Costard and S. Delaître, Applied Physics Letter 25, 1150 (1989);

E. Rosencher, P. Bois, J. Nagle, E. Costard and S. Delaître, Electronic Letter 25, 1063 (1989).

These properties can be used for the detection and optical processing of electromagnetic radiation. In these asymmetric quantum wells, in addition to the asymmetric potential along the growth axis, a double lateral confinement is created. This allows literal asymmetric "superatoms" to be obtained in a single direction, with completely discrete energy levels whose spacing can be adjusted by the growth parameters, the choice of materials and the dimensions $L_x$, $L_y$ and $L_z$ of the quantum hole.

Figure 16:
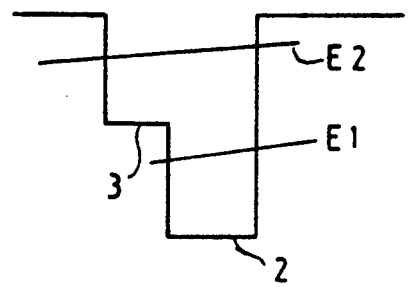

As shown in FIGS. 14 and 15, each quantum hole is made from a material 2 and a material 3 such that the structure has the energy profile in the conduction band shown in FIG. 16. FIG. 16 shows an energy level diagram for layers 2 and 3 as a function of position across the two layers. This figure shows energy level $E_1$ confined to the second layer and energy level $E_2$ confined to the quantum well defined by both layers.

Material 2 has the lower energy at the bottom of the conduction band whereas material 1, with a higher energy, constitutes the barriers of the well.

The quantum well (hole) has a first allowed level $E_1$ situated in the narrowest part of the well and a second allowed level $E_2$ in the widest part.

When illuminated by electromagnetic radiation of a given excitation wavelength, the electron in the ground state $E_1$ of the box is excited to level $E_2$, provided the energy difference corresponds is approximately to the wavelength of the photon. These two levels have distinct barycenters along the growth axis and an electric dipole will develop in the structure, introducing strongly non-linear properties. The lifetime of this dipole, to which the extent of the observed effects is associated, is equal to the lifetime of the excited state. In simple asymmetric wells the lifetime is short (about 1 ps) since the 2D states are not quantized in other intermediate directions and only the radiative recombination to the ground state is possible. The lifetime in the excited state will be longer, about 10 ns, and the non-linear coefficients are 5 orders of magnitude larger.

The device can be used for the detection of electromagnetic radiation. In this case these dipoles will be detected at the terminals of the device containing such quantum holes. The device is fitted with electrodes, of the same conductivity type, to which a detector is attached.

Other non-linear properties of such a structure can also be used, possibly with the addition of a third level (which can be virtual) for processes involving several photons such as the generation of second harmonics, heterodyning or parametric amplification.

These quantum holes can be made by pairs of holes each constituting a dipole with the same applications as for asymmetric boxes.

This device can be used for the detection of electromagnetic radiation. In this case the devices will operate in an optimal way up to wavelengths of 40 μm.

Another interest of quantum holes compared with quantum films is the following.

To couple the incident light and the dipole, the light must imperatively be polarized parallel to the growth axis in the case of quantum films, i.e. the illumination must be at Brewster's angle to maximize the coupling, and even in this case it is only 1%.

In the case of boxes, the excited level is in fact a threefold degenerated level. Therefore if the difference between the levels $E_{1x}$, $E_{1y}$ and $E_{1z}$ is less than 36 meV, i.e. the energy of a longitudinal optical phonon in GaAs, all polarizations of the incident light will allow optical excitation and in all cases some of the electrons will relax to the $E_{1z}$ level by diffusion of acoustic phonons or impurities and the dipole will effectively be formed along the z axis.

Figure 17:
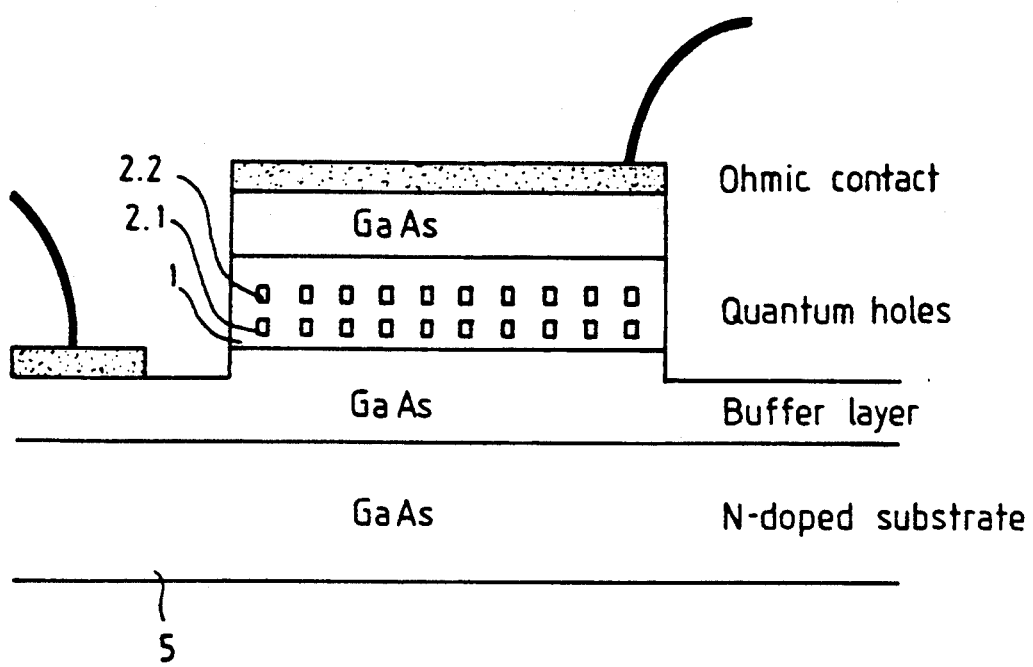
FIG. 17: a quantum well detector of electromagnetic radiation.

Finally, as another application, the structure of the quantum holes described here can be used as a device for the detection of electromagnetic radiation by photoelectric current. FIG. 17 shows such a device: on a doped substrate a buffer layer of the same doped material is grown. This is followed by several layers of the quantum hole structure, then a doped layer of the material of narrow forbidden band. Using standard microlithographic techniques a mesa is formed and the substrate is fitted with an ohmic contact. The upper layer is fitted with an ohmic contact transparent to the radiation to be detected. These two contacts have the same conductivity type. The operation of the device is as follows. An electrical tension is applied across the contacts; the photons of a given wavelength excite the electrons initially in the lowest level of the quantum holes:

Either to a higher level of the well if the energy difference between the excited level and the fundamental level is approximately equal to the excitation wavelength;

Or above the conduction band of the barrier material; the electrons then leave the well by tunneling under the influence of the electric field created by the applied voltage, which creates a current measurable in the external circuit.

Compared with classical techniques using two-dimensional quantum wells, the advantage of the proposed structure is:

The electrons can be easily excited and the increased localization of the elections in the two-dimensional quantum well considerably increases the coupling and therefore the absorption;

The probability of recapture of an ejected electron in another well is reduced because the interaction with the vibrations of the crystal structure do not allow in first order such a capture in the case of a completely discrete level of the well.

The construction of quantum holes or lines can be achieved in several ways.

According to the procedure shown in FIG. 18a and 18d, on a substrate S alternate layers of the materials corresponding to the material of layer 1 and the quantum wells in the preceding description are deposited (FIG. 18a).

Next, parts of the dimensions of the quantum holes (or lines) are etched by masking (see FIG. 18b). It is possible to engrave parts as small as 80×80 nm. From an electronic point of view, such geometrical sections correspond to quantum holes of 20 to 30 nm.

Finally, a deposit of material identical to layer 1 is made (FIG. 18c) and, if necessary, the structure is planarized (FIG. 18d).

According to another procedure shown in FIGS. 19a and 19b, the parts G1 are made by etching a substrate (FIG. 19a).

Next, a selective growth (FIG. 19b) is made on the this etched substrate which creates anisotropies in two different ways: in the direction of growth, owing to the directionality of the growth; in a perpendicular direction to the growth by etching asymmetric forms. This growth procedure is described in an article by Y. D.

Galeuchet, P. Roentgen and V. Graf, Applied Physics Letters, 53, 2628 (1988). The structure is then planed?? if necessary as in the procedure described previously.

Figure 20:
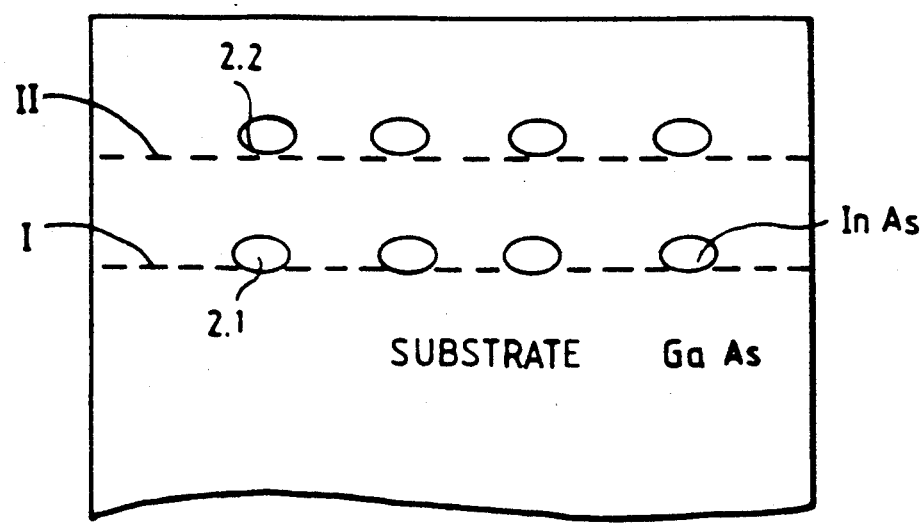
FIG. 20: an example of a method of construction of the device according to the invention by nucleation.

Finally, according to the procedure shown in FIG. 20, quantum holes can also be made by three-dimensional nucleation on a plane interface I. The nucleation procedure is described in an article by L. Goldstein, F. Glas, J. Y. Marzin, M. N. Charasse and G. Le Roux, Applied Physics Letters, 47, 1099 (1985).

This method allows asymmetries to be obtained easily in the direction of growth by varying the fluxes during growth. Coupled quantum holes are obtained if the distance between holes is sufficiently small to allow delocalization of wave functions between two adjacent quantum holes. After having made the quantum holes such as 2.1 in a surface I, a deposit of material identical to that of the substrate is made. Another surface II is obtained (shown as a dashed line) on which other quantum holes can be made such as 2.2, and so on.

For simplicity, we have represented the quantum holes by cubes everywhere in the diagrams. All forms are acceptable as long as the characteristic dimensions are of the order of, or less than, the electron de Broglie wavelength.

The active materials can be of very varied nature, for example the families IV, III-V, II-VI or IV-VI. It is not indispensable that the localization of the holes takes place in the boxes (or the wires) in which the electrons are quantified. However the boxes can be localized in the material around the boxes. This depends on the materials used. This can be achieved with a pair of materials GaSb/InAs.

The preceding description concerns structures in which the active particles are electrons, but similar structures can be conceived in which the active particles are holes by using type P doping instead of type N.

It is clear that the preceding description is a non-restrictive example and that other variants can be envisaged within the framework of the invention. The numerical examples and the natures of the materials and the methods of construction are given only to illustrate the description.

What is claimed is:

1. Quantum well optical device structure, comprising:
   a semiconducting first material having a first band gap and a conduction band bottom at a first potential energy, so that said first material is transparent to a light wave whose energy is less than said first band gap;
   at least one quantum well comprising a second material and limited in at least two dimensions which define at least one of a quantum wire and a quantum box, said at least one quantum well disposed in said first material said at least one quantum well has a potential energy at the bottom of the conduction band which is less than that of the first semiconducting material and also possesses at least one ground state allowed first energy level and a second allowed level at an energy above the ground state and below the bottom of the conduction band of said first semiconducting material; and
   means for providing an electron population to the first allowed energy level.

2. Quantum well optical device structure according to claim 1 wherein the means for providing an electron population comprises type N or type P doping of the boxes or the material surrounding them.

3. Quantum well optical device structure according to claim 1 wherein the means for providing an electron population includes a pumping beam which creates electrons and holes, whose energy is greater than the band gap of the well.

4. Quantum well optical device structure according to claim 1, further comprising:
   several quantum wells which are quantum confined in at least two dimensions which define at least one of quantum wires and quantum dots.

5. Quantum well optical device structure according to claim 1 wherein the quantum wells are spaced at sufficient distance to limit their electronic coupling.

6. Quantum well optical device structure according to claim 4 wherein:
   the quantum wires are disposed along an xy plane.

7. Quantum well optical device structure according to claims 6, further comprising:
   several planes of quantum wires each plane extending in an xy plane, these planes lying parallel to each other and displaced from one another along the z direction.

8. Quantum well optical device structure according to claim 7 wherein the quantum wires of a plane are staggered relative to the quantum wires of another plane.

9. Optical device structure according to claim 4 wherein the layer lies parallel to the xy plane and includes several quantum boxes aligned in a line parallel to the xy plane.

10. Optical device structure according to claim 9, further including several parallel lines of quantum boxes in a plane parallel to the xy plane.

11. Optical device structure according to claim 10, further including several parallel planes of quantum holes.

12. Optical device structure according to claim 11 wherein:
    the quantum boxes are disposed along parallel planes and the quantum boxes in a plane are staggered relative to those of a neighboring plane.

13. Optical device structure according to claim 1 wherein the layer of semiconducting material has a certain refractive index and lies between two layers of a material with a lower refractive index.

14. Quantum well optical device structure according to claim 1 wherein:
    the first material comprises a layer with two principle faces oriented with said principal faces parallel to a plane xy of an xyz trihedron, the quantum wells extend along the x direction;
    faces of the first material which are perpendicular to the x direction are cleaved or optically treated to constitute an optical cavity;
    and further comprising an auxiliary source for supplying a pump wave which propagates approximately perpendicular to the principal faces.

15. Quantum well optical device structure according to claim 12 wherein the energy per photon of a pump wave supplied by an auxiliary source is greater than the difference in energy between the first allowed level and second allowed level.

16. Quantum well optical device structure according to claim 12 wherein the wavelength of the pump wave supplied by the auxiliary source is greater than or equal to the interband transition energy (conduction band-valence band) of the semiconductor constituting the hole, plus the band discontinuity between the material of the hole and the material surrounding it, plus the confinement energy of the holes.

17. Optical device structure according to claim 1:
said first material has two principal faces parallel to a plane xy of an xyz trihedron, each equipped with an electrode of the same conductivity type;
a voltage generator is connected to these electrodes to apply a potential difference to the structure;
said faces of the layer perpendicular to the x direction are cleaved or treated to constitute an optical cavity.

18. Optical device structure according to claim 17 further including several quantum wells arranged in a plane parallel to the xy plane.

19. Optical device structure according to claim 17 further including quantum wells along a layer parallel to one of the electrodes to which the generator applies a negative potential relative to the potential applied to the other electrode.

20. Optical device structure according to claim 1 including electrodes of the same conductivity type on the two sides of said first material and a detector of the potential difference connected across these electrodes.

21. Optical device structure according to claim 1 further including an electrode on each of the two sides of the layer of transparent semiconducting material and a voltage source for applying a potential difference to the electrodes, a light beam being transmitted in the layer to be modulated by the device.

22. Optical device structure according to one of claims 20 or 21, further including several quantum wells coupled in pairs, two coupled wells being separated by a distance allowing electrical coupling between them.

23. Optical device structure according to one of claims 20 or 21 wherein each well includes two types of materials adjacent to one another, the energies of the bottom of the conduction band of these materials being different.

24. Optical device structure according to claim 1 wherein each well includes two types of materials adjacent to one another, the energies of the bottom of the conduction band of these two materials being different.

* * * * *